United States Patent [19]

Brilman

[11] Patent Number: 5,684,508
[45] Date of Patent: Nov. 4, 1997

[54] METHOD OF DISPLAYING CONTINUOUSLY ACQUIRED DATA AS MULTIPLE TRACES ON A FIXED LENGTH DISPLAY

[75] Inventor: Klaas Jan Brilman, Oldenzaal, Netherlands

[73] Assignee: Fluke Corporation, Everett, Wash.

[21] Appl. No.: 560,246

[22] Filed: Nov. 21, 1995

[51] Int. Cl.⁶ .................................................. G09G 5/36
[52] U.S. Cl. ........................... 345/134; 345/127; 395/140
[58] Field of Search ......................... 345/134, 127–131, 345/114, 115; 324/121 R; 395/149, 341

[56] References Cited

U.S. PATENT DOCUMENTS

| | | | |
|---|---|---|---|
| 4,110,564 | 8/1978 | Andresen | 345/134 |
| 4,755,811 | 7/1988 | Slavin et al. | 345/134 |
| 4,809,189 | 2/1989 | Batson | 345/134 |
| 4,837,561 | 6/1989 | Tucker | 345/134 |
| 5,028,914 | 7/1991 | Povenmire | 345/134 |
| 5,039,937 | 8/1991 | Mandt et al. | 395/341 |
| 5,075,618 | 12/1991 | Katayama | 345/134 |
| 5,129,722 | 7/1992 | Mailer et al. | 345/134 |
| 5,365,254 | 11/1994 | Kawamoto | 345/134 |
| 5,434,954 | 7/1995 | Kawauchi et al. | 395/140 |
| 5,517,105 | 5/1996 | Holzworth | 345/134 |
| 5,519,820 | 5/1996 | Kawauchi et al. | 395/140 |
| 5,526,473 | 6/1996 | Patel | 395/140 |
| 5,550,963 | 8/1996 | Siegel et al. | 395/140 |

*Primary Examiner*—Steven Saras
*Attorney, Agent, or Firm*—Douglas J. Barker

[57] ABSTRACT

A method of displaying continuously acquired measurement values as a plurality of traces in a display with a fixed number of pixels is provided. An input signal is captured as a series of acquired input signals. Measurement values are calculated from the acquired input signals according to a set of measurement parameters. The measurement values are plotted to a display as a plurality of traces according to the measurement parameters. Each of the traces may be scaled vertically independently of one another. At the end of the fixed number of pixels of the display, the pixel values are compressed to half the fixed number of pixels and the pixel rate is halved, thereby doubling the time scale. As a minimum pixel rate is eventually reached, the traces are then scrolled in a roll mode in which the newest measurement value is added to one end of the display and the old value at the other end is discarded. This scrolling process can continue indefinitely, requiring no operator intervention or prior knowledge to set a total measurement time.

5 Claims, 6 Drawing Sheets

METHOD OF DISPLAYING CONTINUOUSLY ACQUIRED DATA AS MULTIPLE TRACES ON A FIXED LENGTH DISPLAY

BACKGROUND OF THE INVENTION

This invention relates generally to methods of graphically displaying data and specifically to a method for graphically displaying a stream of continuously acquired measurement values in the form of multiple, independent traces using a display with a fixed number of graphical display elements.

Graphical representation of electrical signals over time is a particularly important tool for analysis and troubleshooting. Electrical signals may include voltage potentials, such as a.c. (alternating current) power line voltage and current, as well as the output of sensors that measure physical phenomena such as temperature, pressure, acceleration, or physical position, among others. A graphical history of the electrical signal provides the user with valuable insight into its behavior over time, by observing both long-term trends and short-term transitory events. For example, an automobile electrical system voltage can be monitored over a 10 minute period to observe its long-term stability while allowing for the detection of short-term surges and drop-outs which may occur during charging and load switching.

A variety of instrumentation has been developed to measure electrical signals and display the measurements in graphical form. Strip chart recorders have been used for many years for the task of monitoring of electrical signals over an extended period of time. The selection of recorder speed and the available supply of chart paper determined the length of time the electrical signal could be monitored while the analog bandwidth of the chart recorder amplifier and d'Arsonval meter movement determined the shortest transitory event that could be detected. Furthermore, strip chart recorders provide an indication only of the immediate signal voltage level, with no processing of the signal to obtain measurement parameters. Analog oscilloscopes, on the other hand, display relatively fast, repetitive waveforms on a cathode ray tube but generally with no capability for monitoring long-term trends.

Strip chart recorders have largely given way to data acquisition systems, which digitize electrical signals and store the measurement information as digital data in computer memory. The signal is "sampled" by converting the signal voltage at a designed time into discrete measurement values as represented by digital measurement data using an analog-to-digital converter ("ADC"). Data acquisition systems are often comprised of specialized data acquisition boards that deliver the measurement data to a personal computer ("PC"). The data acquisition board digitizes the input signal and the PC handles the tasks of data collection, storage, and display. Because of fundamental limitations in the amount of data storage available in a PC, the PC-based data acquisition system faces many of the same time limitations of the original strip chart recorder. Instead of chart speed, the user must select a measurement sample rate. A faster sample rate yields higher time resolution measurements but also consumes memory at a faster rate. Data acquisition systems are designed primarily for collecting and storing large amounts of sampled voltage values for later analysis and display.

Analog oscilloscopes have, in turn, largely given way to digital storage oscilloscopes ("DSO's") which are optimized to sample signals much faster than a typical data acquisition system. DSO's largely emulate their analog cousins by displaying the waveform of an acquired signal. In addition, DSO's are often equipped with some post-processing capability in order to obtain a display of various signal parameters such as frequency, rise time, pulse width, and so on. Such parameters are typically displayed numerically on the screen along with the waveform as supplemental information for the user of the DSO.

There is a need for measurement instruments that are capable of continually measuring and displaying an electronic signal with no need to determine a total measurement time beforehand and with no need to restart the measurement. A method for displaying continuously acquired data on a fixed length display was disclosed in pending U.S. patent application Ser. No. 08/301,938 (the '938 application), filed Sep. 7, 1994, and assigned to Fluke Corporation, assignee of the present invention. The disclosed method provides for displaying continuously acquired measurement values on a display with a fixed number of pixels which allows for the automatic setting of the time scale such that collected pixel information is compressed into a fraction of the total display as the last pixel is reached, thereby perpetually providing room for new pixel information to be displayed. The method disclosed in the '938 application provides for the display of only one stream of measurement values at a time.

It would be desirable to continuously display multiple, independently-calculated measurement values as graphical traces on a fixed length graphical display in order to provide more information to the instrument operator. It would be further desirable that each trace be automatically scaled responsive to the magnitude of the respective trace data so that no operator intervention is required to view useful trace information.

SUMMARY OF THE INVENTION

In accordance with the present invention, a method of displaying multiple parameters as multiple, independent traces in a fixed number of pixels calculated from continuously-acquired measurement values is provided in a measurement instrument. Multiple measurement values are calculated according to selected measurement parameters and plotted at a pixel rate as multiple traces. Each pixel represents a time element in a time-ordered display and is a graphical representation of the data stored in a corresponding memory location in the waveform memory in the measurement instrument. The present invention is an improvement which allows multiple measurement values from multiple input signals to be independently calculated and plotted for each respective pixel location. Over the time interval between each pixel, an input signal is acquired and measurement values are collected from the acquired input signal. The microprocessor calculates trace information from the measurement values based on the selected measurement parameters.

Different measurement parameters may be chosen as a basis to calculate each trace. In an automotive application of the measurement instrument, for example, it may be desirable to display RPM (revolutions per minute), duty cycle, pulse width, and average voltage, all calculated from an input signal acquired over an acquisition time according to the selected measurement parameters. In this way, a maximum amount of visual information about an input signal may be collected, calculated, and displayed over an indefinite period of measurement time.

The display of the measurement instrument thus provides a time-ordered history of multiple, independently calculated measurement values. In this way, relationships and dependencies between the various measurement parameters can be visually analyzed. In the above automotive example, the RPM of an automobile engine in a service application may be increased and its effects on the other parameters over time may readily be observed by comparing the relative trace levels for each corresponding pixel.

As each pixel is plotted, the vertical scale of each graphical plot is adjusted if necessary to fully display all pixel information of each trace across the display in the maximum number of available vertical pixels. Automatic vertical scaling ensures that the pixel information is displayed in the same scale across the display and is at all times viewable by the operator with no manual intervention needed to adjust the vertical scale.

Because the instrument display has a fixed number of pixels and it is desirable that the measurement instrument provide a time history of the multiple parameters while the instrument continuously acquires data from the input signal, the use of pixel compression and roll mode techniques are employed in the present invention. As the last pixel in the trace is reached at the end of a first complete sweep, a compression operation is performed on the displayed traces in a like manner. First, the time scale is doubled to twice that of the previous sweep by halving the rate at which new measurement values are acquired. Second, the pixel information for each measurement parameter previously collected and stored in waveform memory are compressed into the first half of the total available waveform memory. Each memory location contains information that maps into a particular pixel of the display. Finally, the newly freed memory locations in the second half of the waveform memory are then available for displaying new pixel information but the pixel rate is now halved so that the newly acquired pixels match the effective pixel rate of the previously acquired and now compressed pixels. In a given sweep, therefore, the number of measurement values used to calculate a pixel, whether currently acquired or compressed, remains constant which allows continuously acquired measurement data to be automatically accommodated over an ever increasing measurement time while maintaining the same time scale for each pixel to provide a consistent time series display of the calculated traces.

No information is lost in the compression process, with each pixel containing the trace information calculated from the measurement values. For example, as two adjacent pixels are compressed into one, the minimum of the two minimum values and the maximum of the two maximum values become the combined minimum and maximum for the new pixel. Similarly, the average of the two pixel averages is taken which yields the combined average. Compressing the pixel information in this way yields precisely the same minimum, maximum, and average values that would have been calculated from the measurement data had the two pixel been combined first before calculating the minimum, maximum, and average of the individual pixels. The information contained in compressed pixels is equivalent to that of a currently acquired pixel both in the number of measurement values represented in the calculation and also in the results of the processing of the information.

After a predetermined number of compression operations have taken place over an extended period of measurement time, the pixel rate and sweep may become lower than desirable for certain applications. Rather than continue with another compression operation when the end of the sweep is reached in which the pixel rate would be halved again, another sweep mode is implemented called "roll mode". In roll mode, the pixels are displaced in a "first in, first out" arrangement in which the newest pixel is displayed on the right half of the display and the information contained in the other pixels is shifted to the left by one pixel. The oldest pixel contained in the left-most pixel is discarded. In this way, the display resembles the strip chart recorder in that the traces appear to move from the right to the left over time with a fixed sweep time.

One object of the present invention is to provide a method of displaying continuously-acquired measurement values on a fixed-length display as multiple, independently calculated measurement graphical traces.

Another object of the present invention is to provide a method of displaying continuously-acquired measurement values on a fixed-length display as multiple, independently calculated measurement graphical traces with automatic time scaling to accommodate measurement periods of indefinite length.

An additional object of the present invention is to provide a method of displaying continuously acquired measurement values on a fixed-length display from multiple input signals and calculated according to multiple measurement parameters which are displayed as multiple independent graphical traces.

Other features, attainments, and advantages will become apparent to those skilled in the art upon a reading of the following description when taken in conjunction with the accompanying drawings.

DETAILED DESCRIPTION OF THE INVENTION

Figure 1:
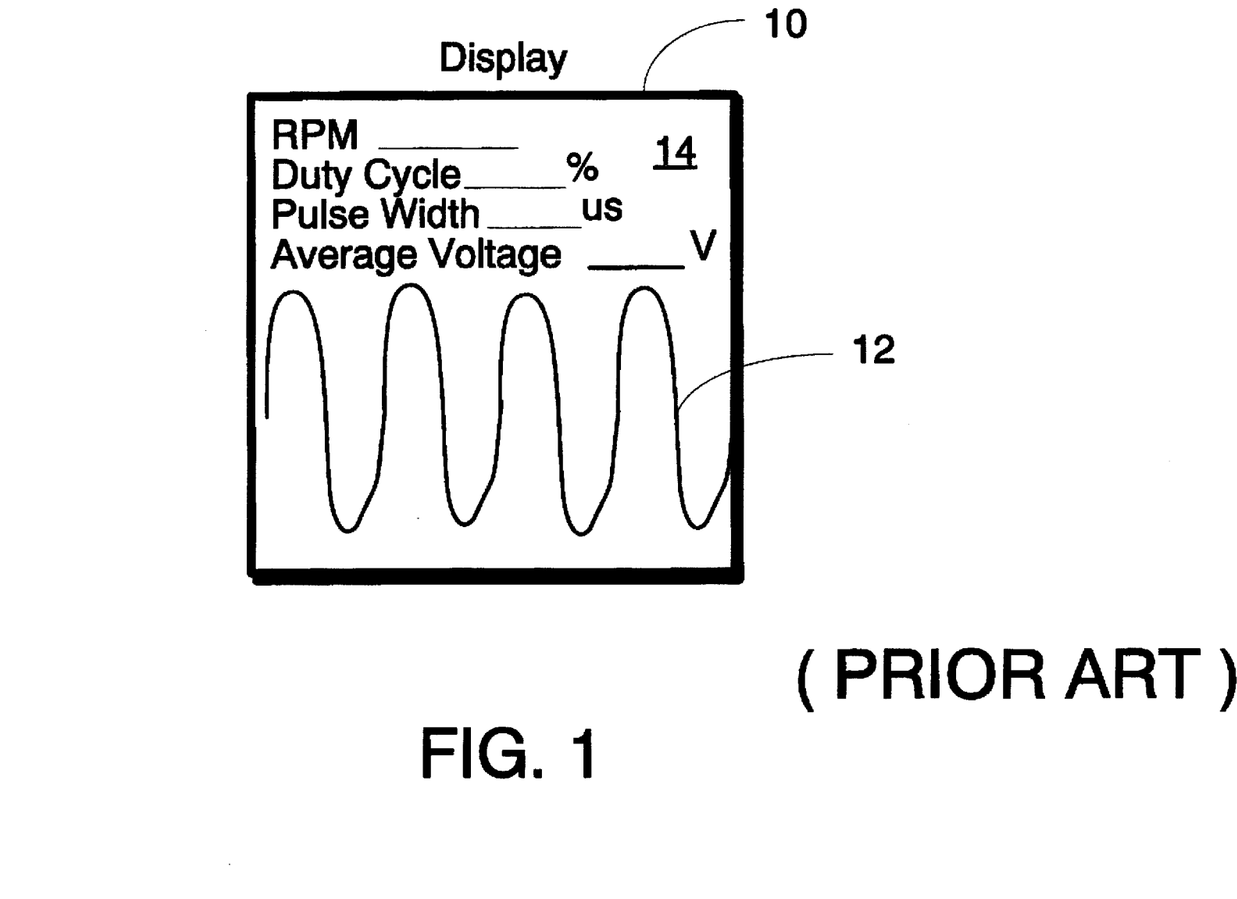
FIG. 1 is a diagram of typical DSO display showing an acquired signal and numerical measurement parameters according to the prior art.

Referring now to FIG. 1, there is shown a graphical plot of an acquired signal and numerical measurement parameters according to the prior art. A display 10 is a graphical display device which may be coupled to a typical digital storage oscilloscope (DSO). The display 10 may be implemented with cathode-ray tubes, dot-matrix liquid crystal displays (LCD's) or other display technologies known in the art for displaying graphical plots. Shown in the display 10 is a graphical trace representing an acquired input signal 12 which has been captured by the DSO. An acquired input signal 12 may typical consist of at least one period of a periodic input signal that is digitized and stored such that measurement values may be calculated from the stored waveform. The amplitude and time parameters of the acquired input signal may be preserved so that the calculations may be performed. From the acquired input signal 12, measurement values 14 are calculated according to a set of selected measurement parameters may be collected and displayed on the display 10. The measurement parameters of RPM, Duty Cycle, Pulse Width, and Average Voltage are shown in the FIG. 1 as a representative set as an example. The measurement values 14 may be collected from a single input signal or from multiple input signals as needed.

Figure 2:
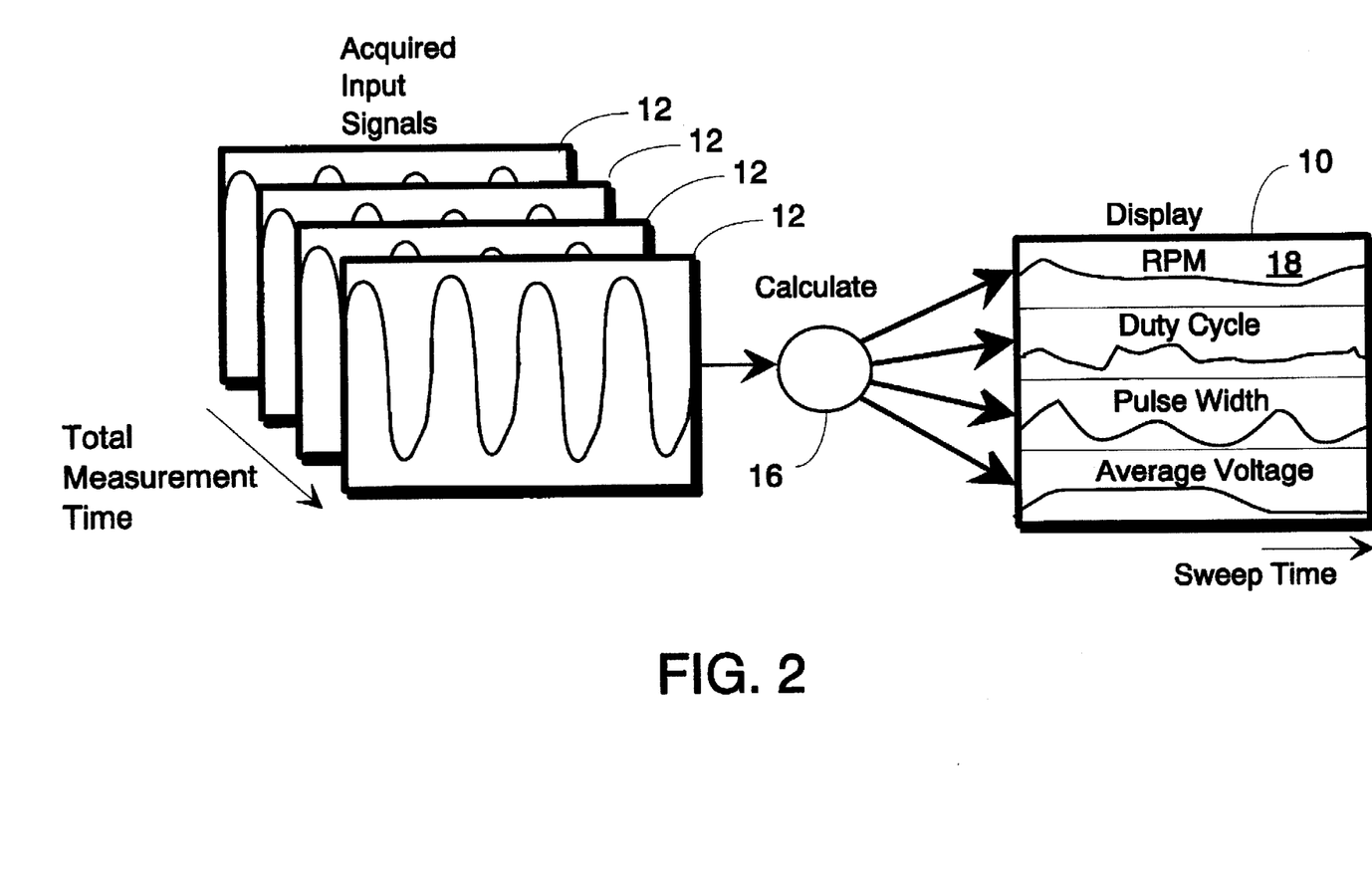
FIG. 2 is a diagram illustrating the process of calculating multiple measurement parameters from multiple acquired signals and displaying the parameters as multiple traces on a fixed length display according to the present invention.

FIG. 2 illustrates the process of continuously displaying measurement values 14 derived from the acquired input signals 12 according to the present invention. Over a total measurement time, the acquired input signals 12 may be collected by a measurement instrument. It is desirable that the total measurement time for measuring the input signal be indeterminate, so that the measurements be allowed to continue without any requirement for restarting the measurement sequence or for deciding on a total measurement time before starting the measurement.

The display 10 contains a fixed number of vertical and horizontal pixels. Because the amount of information that may be displayed on the display 10 is limited, methods of vertical and horizontal scaling are employed to display the maximum amount of information about the input signal being measured. A trace is a graphical representation of a set of collected measurement values which are stored in digital memory in the form of arrays. As shown in FIG. 2, the display 10 is divided into four horizontal segments for plotting each of a set of traces 18. More traces or fewer traces may be readily selected according to the application requirements.

Figure 3A:
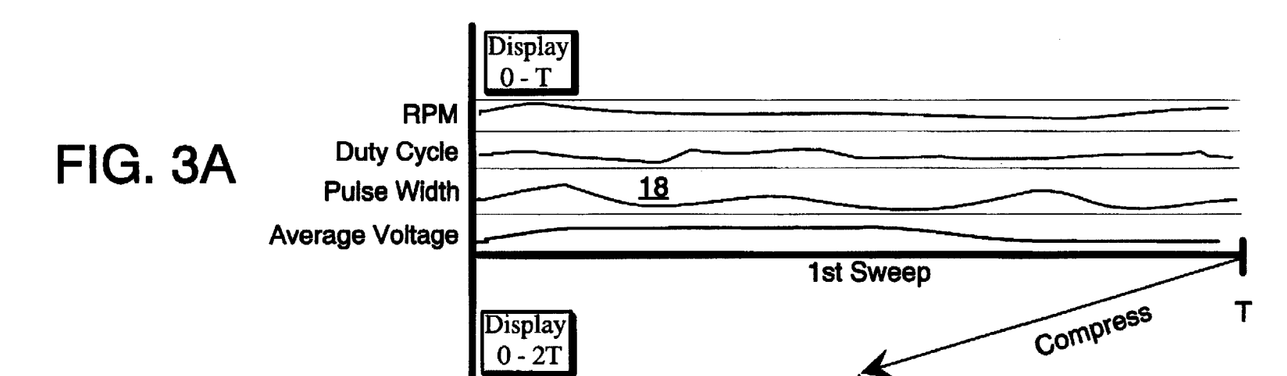
FIG. 3A–C together form a graph illustrating a method of compressing the multiple traces in the fixed length display according to the present invention.
Figure 3B:
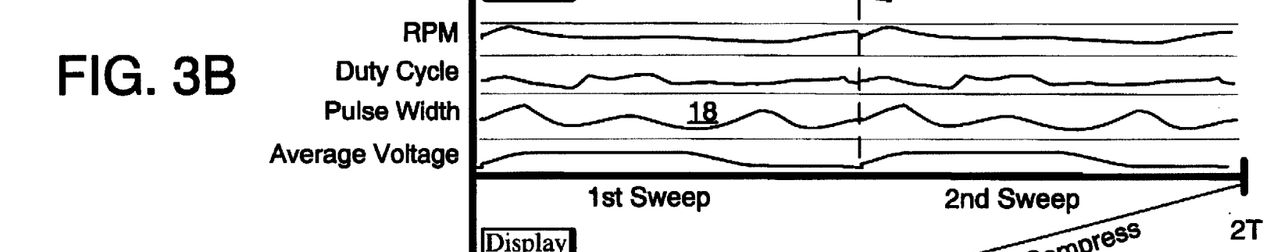
Figure 3C:
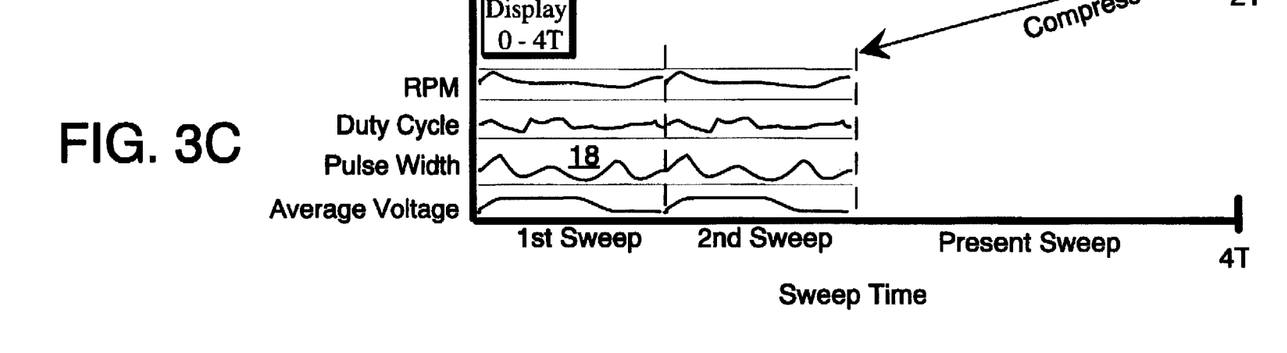

FIG. 3A–C together form a graph illustrating a method of compressing the multiple traces in the display 10 according to the present invention. Each acquired input signal 12 of a series acquired from the input signal over the total measurement time is submitted to the calculate process 14 which calculates measurement values according to the set of measurement parameters and plots them as a selected set of traces 18. Each trace is vertically scaled according to the maximum and minimum values contained in each trace to take maximum advantage of the available vertical pixels. To take maximum advantage of the number of horizontal pixels according to the present invention, compression and roll modes are employed as explained below.

FIG. 3A–C together form a graph illustrating a method of compressing the multiple traces 18 in the fixed length display 10 according to the present invention. In FIG. 3A, a first sweep is shown. The set of traces 18 consist of the measurement parameters previously selected in FIG. 1 and 2 by way of example, including RPM, Duty Cycle, Pulse Width, and Average Voltage. In the first sweep, the measurement values received from the calculate process 16 are plotted as a set of traces 18 on the display 10, moving from the left to the right. At the end of the sweep at time T, a compression operation is performed as denoted by the arrow labeled Compress. It can be seen that the set of traces 18 are now compressed into the first half of the display, as shown in FIG. 3B.

Because the traces 18 are graphical representations of the set of measurement values stored in digital memory, the compression process is performed by combining each adjacent pair of measurement values stored in the digital array corresponding to each trace. For example, the first and second measurement values, the third and fourth measurement values, the fifth and sixth measurement values, and so on would be mathematically combined to form a new measurement values in the array. Ways of mathematically combining two measurement values include calculating the average, the minimum, or the maximum of the two measurement values, depending on the type of information being preserved in the compressed trace. New measurement values that arrive after the compression operation are appended to the compressed trace beginning at the second half of the display 10 at half the pixel rate of the first sweep so that the time scale between the first and second halves of the display 10 match. At the end of the second sweep at time 2T, the traces 18 are again compressed in the same manner as before to the first half of the display 10 as shown in FIG. 3C.

The pixel rate of the third sweep is one fourth of the pixel rate for the first sweep. At the end of the third sweep, it is desirable that the sweep rate not be reduced further and that the total sweep time, now at time units of 4T, is a time record that is long enough for the intended application. In the present invention, 4T corresponds to a sweep time of 10 minutes. The measurement instrument then operates according to a roll mode as illustrated in FIG. 4.

Figure 4:
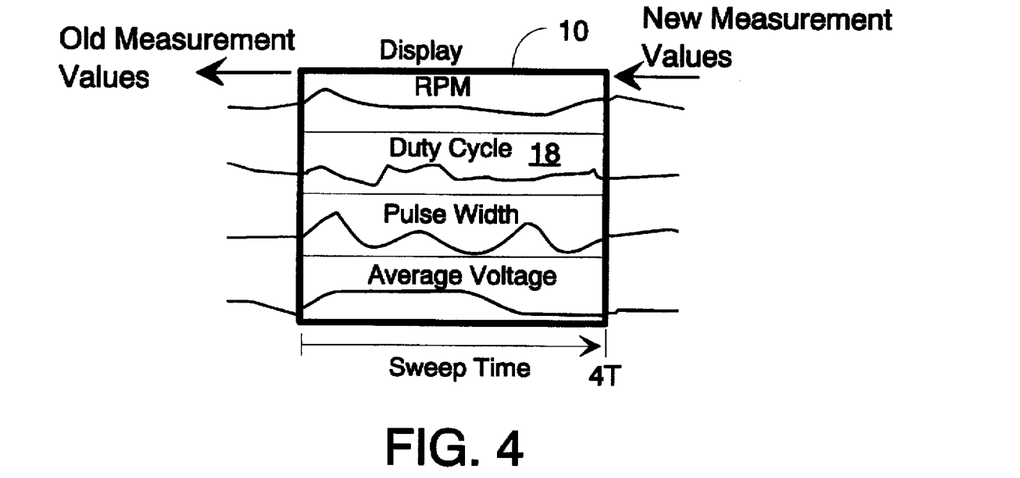
FIG. 4 is a graph illustrating a method of scrolling the multiple traces on the fixed length display according to the present invention.

Referring now to FIG. 4, there is shown a graph illustrating a method of scrolling the multiple traces as a roll mode on the fixed length display according to the present invention. Scrolling allows the set of traces 18 to continue to be updated with new measurement values 18 which are appended to the left-most pixel while the right-mode pixel containing the oldest measurement values are no longer displayed and possibly discarded. The middle pixels are all shifted to the left by one pixel. In this way, each trace of the set of traces 18 appear to be moving from the right to the left to simulate the action of a waveform recorder. The sweep rate and pixel rate remain constant over the total measurement time. Roll-mode allows the measurement values 14 to continue to be collected over an indefinite time interval with a fixed sweep time but at the expense of losing the oldest measurement values.

Figure 5:
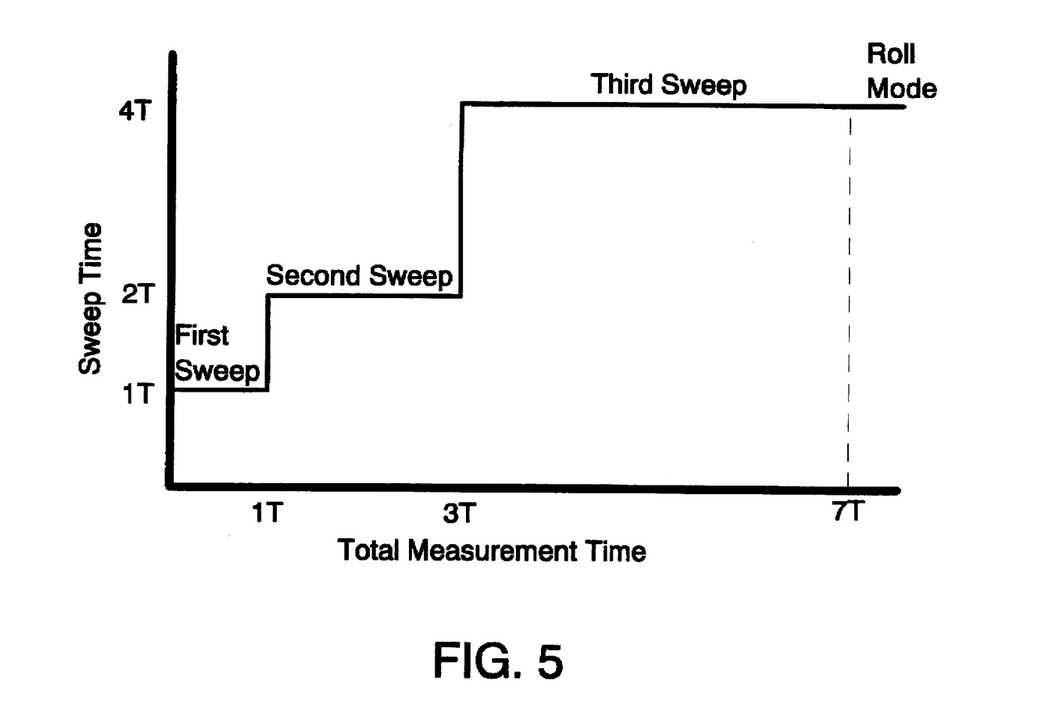
FIG. 5 is a graph (not to scale) illustrating the overall relationship between sweep time and overall measurement time.

FIG. 5 is a graph (not to scale) illustrating the overall relationship between sweep time and total measurement time. The horizontal axis represents overall measurement time in units of time T and the vertical axis represents sweep time in units of time T. The first sweep takes time T to complete, followed by the second sweep, which takes 2T to complete for an overall measurement time of 3T units. The third sweep starts at 3T and takes 4T units to complete, ending at a total measurement time of 7T. At 7T, roll mode commences, with the sweep time now fixed at 4T, for any period of time beyond 7T. It will be noted that FIG. 5 shows only the sweep time versus total measurement time. FIG. 5 implicitly assumes no processing or display time is required between signal acquisitions. Additional processing and display time, if needed, would be factored into the horizontal axis of the graph as additional time.

Figure 6:
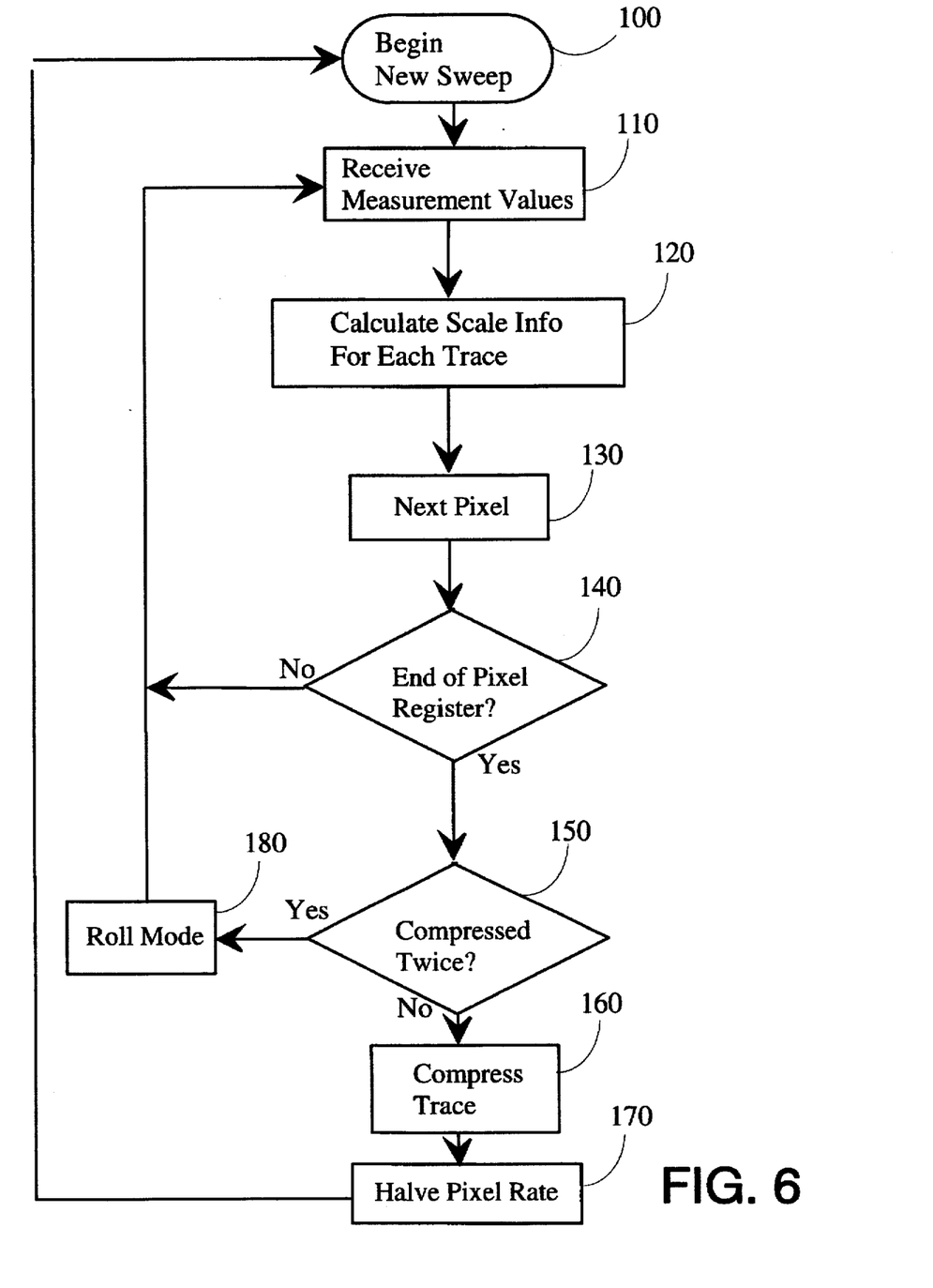
FIG. 6 is a flow diagram of the method of compressing and rolling the multiple traces.

FIG. 6 is a flow diagram that shows the steps of processing the measurement values 14, calculating and displaying a set of traces 18 calculated from the measurement values 14, and compressing the traces 18 at the end of each sweep. Process 100, labeled Begin New Sweep, sets up the start of a new first sweep. The first sweep of the measurement plots measurement values from the left to the right across the display 10 as the set of traces 18 calculated according the set of measurement parameters.

In Process 110, labeled Receive Measurement Values, the various measurement values 14 are collected, placed in digital memory in an array location corresponding to a desired pixel of the display 10, and the used to plot the plot the trace on the display 10 at the desired pixel location.

In Process 120, labeled Calculate Scale Info For Each Trace, the vertical scaling information for each trace is calculated so that the maximum amount of information for each trace may be shown on the display 10. The new scale need not be calculated for each new pixel but may be done according to the requirements of the application. Each trace may be independently scaled from the other traces.

In Process 130, labeled Next Pixel, the next pixel in the display 10 is selected according to the pixel rate. A complete sweep consists of consecutively selecting pixels across the display 10 at the pixel rate until the last pixel is reached. After the first sweep, all other sweeps start in the middle of the display 10.

In Process 140, labeled End of Pixel Register, if the next pixel is the last pixel in the display 10, the sweep is at an end and a compression operation is employed to compress the trace information into the first half of the pixel register. If the next pixel is not the last pixel in the display 10, more measurement values may be received and the program loops back to Process 110.

In Process 150, labeled "Compressed Twice?", if there have been two compressions since the first sweep, the traces 18 are no longer compressed but simply scrolled according the roll mode as described above. Thus, if not compressed twice, the program branches to the process 160 for compression and otherwise to the process 180 for roll mode.

In Process 160, labeled Compress Trace, the sweep ends as the last pixel in the display 10 is reached. The trace information contained in the digital memory corresponding to each of the traces 18 is compressed into the first half display containing the compressed pixels so that the second half may have free pixels which may be utilized for newly acquired trace information during the present sweep. Compressing pixels is a mathematical operation combining the pixel information stored in digital memory.

In Process 170, labeled Halve Pixel Rate, the pixel rate of the current sweep is adjusted to half that of the previous sweep. In this way, the equivalent time per pixel across the entire display 10, both in the first and the second halves, is the same and the number of measurement values used to calculate each trace value is therefore the same.

In Process 180, labeled Roll Mode, the most recent measurement values 14 are sent to the right-most pixel on the display 10 while the other pixels are shifted to the left by one. The left-most pixel, which is the oldest measurement value, is discarded. Roll mode will continue with the same sweep time of 4T as long as measurements continue to be taken.

Figure 7:
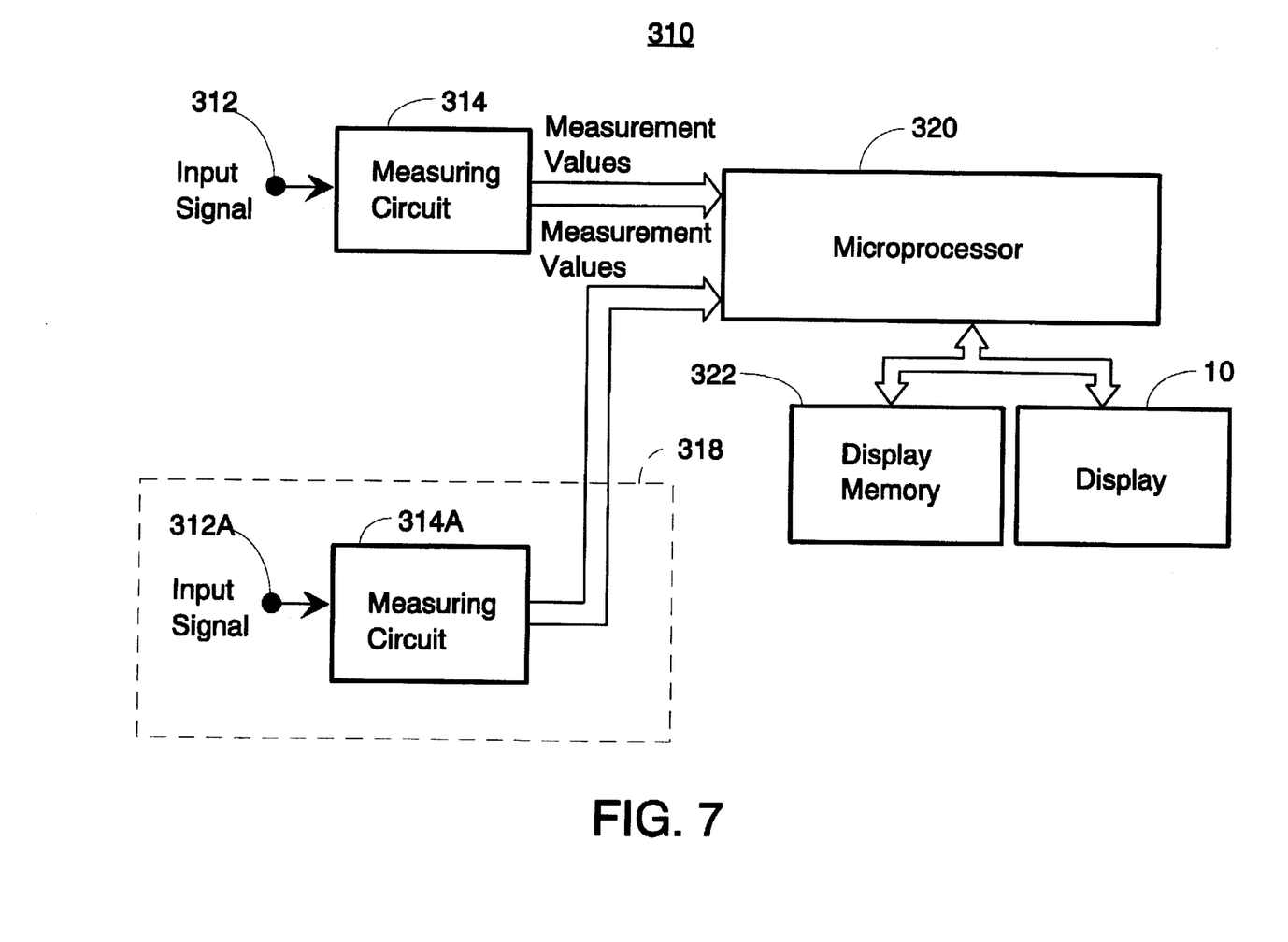
FIG. 7 is a simplified block diagram of an instrument for displaying continuously acquired measurement values according to the present invention.

Referring now to FIG. 7, there is shown a simplified block diagram of a measurement instrument 310 which is adapted for continuously acquiring input signals and displaying traces 18 calculated according to the selected set of measurement parameters. An input signal is coupled to an input terminal 312 which is coupled to a measuring circuit 314 which acquires the input signal and provides digital measurement values 14 from each acquired input signal 12. The input signal, generally a voltage signal, may be derived from pressure, temperature, velocity, acceleration, or any of variety of other physical phenomena which need to be analyzed for long-term trends and short-term stability. The measurement values 14 may be in terms of various measurement parameters, which include by way of example, including RPM, Duty Cycle, Pulse Width, and Average Voltage. Measuring circuit 314 may be an analog-to-digital converter (ADC), a frequency timer-counter circuit, a DSO, or any other measuring circuit capable of providing desired measurement values.

Instrument 310 may be adapted to receive multiple input signals using additional measuring circuits 314A. A second input signal is coupled to an input terminal 312A which is coupled to the measuring circuit 314A to form a parallel input channel 318 to acquire the second input signal and provide measurement values. The second input signal may also be derived from pressure, temperature, velocity, acceleration, or other physical phenomenon. The measurement values from measurement circuit 314A may be obtained independently from the measurement values produced by the measurement circuit 314.

The measurement values 14 from the measuring circuits 314 and 314A are coupled to a microprocessor 320 which places them in a display memory 322. The measurement values 14 for each trace are plotted to the display 10 by the microprocessor 320. The display 10 may consist of any form of conventional computer display and use a variety of graphing and plotting routines well known in the art to display data stored in memory. The display 10 may also consist of a self contained display subsystem with its own microprocessor or be merely a rudimentary display device that depends on microprocessor 320 to execute graphics algorithms well known in the art.

Because each trace is plotted on the display 10 having a fixed number of vertical pixels, each trace may be plotted in such a manner as to display the maximum amount of information possible. This is done by mathematically scaling the vertical axis of the plot according to the maximum positive and negative values contained in the display memory 322 corresponding to a selected trace. Vertical scaling is performed in a manner well known in the art and may be done independently of the scaling of other traces.

It will be obvious to those having ordinary skill in the art that many changes may be made in the details of the above described preferred embodiments of the invention without departing from the spirit of the invention in its broader aspects. For example, the total number of compressions before roll mode begins may be varied depending on the minimum pixel rate desired. Additional inputs 312A and measuring circuits 314A may be added as needed. Trace information may include other types and functions that are amenable to compression while remaining substantially valid regardless of the number of times the pixel information is compressed. Any type of continuously acquired data, whether from an analog or a digital source and whether or not derived from physical phenomenon, that requires a visual display of its value will benefit from this display method. Therefore, the scope of the present invention should be determined by the following claims.

What I claim as my invention is:

1. A method for displaying a plurality of traces calculated from a plurality of acquired input signals comprising:

(a) calculating measurement values from said acquired input signals according to a set of measurement parameters;

(b) storing said measurement values in a digital memory;

(c) plotting said measurement values at a pixel rate to free pixels of a display as said plurality of traces, said display having a fixed number of pixels;

(d) at the end of at least one sweep, compressing said traces into a first half of said fixed number of pixels such that a second half of said display becomes available as free pixels wherein said pixel rate is reduced by half; and (e) at a minimum pixel rate, scrolling each of said traces wherein each of said measurement values in a trace is shifted in digital memory to create one free pixel and an oldest pixel is discarded.

2. A method for displaying continuously acquired data according to claim 1 further comprising scaling each of said traces to obtain a maximum number of vertical pixels of said display.

3. An instrument for continuously displaying measurement values as a plurality of traces, comprising:

(a) at least one measuring circuit with an input for coupling to an input signal to produce a plurality of said measurement values according to a set of desired measurement parameters;

(b) a digital memory coupled to said measuring circuit for receiving and storing said measurement values in an array;

(c) a display for displaying said plurality of traces;

(d) a microprocessor coupled to said digital memory for receiving said measurement values and plotting said measurement values as said plurality of traces in free pixels of said display, wherein:

at the end of at least one sweep, each of said traces is compressed into a first half of said fixed number of pixels so that a second half of said fixed number of pixels becomes available as said free pixels for a subsequent sweep, and said pixel rate is reduced by half for said subsequent sweep, and at a minimum pixel rate, each of said traces is scrolled to create one said free pixel and to discard an oldest pixel.

4. An instrument for continuously displaying measurement values as a plurality of traces according to claim 3 further comprising a plurality of said measuring circuits each coupled to one of a plurality of said input signals to obtain said measurement values.

5. An instrument for continuously displaying measurement values as a plurality of traces according to claim 3 wherein each of said traces is independently scaled to obtain a maximum number of vertical pixels of said display.

* * * * *